(12) United States Patent
Sun et al.

(10) Patent No.: US 11,888,052 B2
(45) Date of Patent: Jan. 30, 2024

(54) SEMICONDUCTOR DEVICE AND MANUFACTURING METHOD THEREOF EMPLOYING AN ETCHING TRANSITION LAYER

(71) Applicant: SUZHOU INSTITUTE OF NANO-TECH AND NANO-BIONICS (SINANO), CHINESE ACADEMY OF SCIENCES, Suzhou (CN)

(72) Inventors: Qian Sun, Suzhou (CN); Shuai Su, Suzhou (CN); Yu Zhou, Suzhou (CN); Yaozong Zhong, Suzhou (CN); Hongwei Gao, Suzhou (CN); Jianxun Liu, Suzhou (CN); Xiaoning Zhan, Suzhou (CN); Meixin Feng, Suzhou (CN); Hui Yang, Suzhou (CN)

(73) Assignee: SUZHOU INSTITUTE OF NANO-TECH AND NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 781 days.

(21) Appl. No.: 17/040,548

(22) PCT Filed: Dec. 31, 2019

(86) PCT No.: PCT/CN2019/130362
§ 371 (c)(1),
(2) Date: Sep. 23, 2020

(87) PCT Pub. No.: WO2020/228352
PCT Pub. Date: Nov. 19, 2020

(65) Prior Publication Data
US 2021/0384339 A1   Dec. 9, 2021

(30) Foreign Application Priority Data

May 10, 2019 (CN) .......................... 201910388910.4

(51) Int. Cl.
*H01L 29/778* (2006.01)
*H01L 29/10* (2006.01)
(Continued)

(52) U.S. Cl.
CPC ...... *H01L 29/7786* (2013.01); *H01L 29/1066* (2013.01); *H01L 29/2003* (2013.01);
(Continued)

(58) Field of Classification Search
CPC ........... H01L 29/2003; H01L 29/66431; H01L 29/66462; H01L 29/778–7789
See application file for complete search history.

(56) References Cited

U.S. PATENT DOCUMENTS

2014/0021480 A1* 1/2014 Jeon .................... H01L 29/7787
257/194
2014/0159119 A1* 6/2014 Derluyn ................ H01L 29/778
257/194
(Continued)

FOREIGN PATENT DOCUMENTS

| CN | 101789446 A | 7/2010 |
|---|---|---|
| CN | 103797581 A | 5/2014 |

(Continued)

*Primary Examiner* — Eric A. Ward
(74) *Attorney, Agent, or Firm* — Bayramoglu Law Offices LLC

(57) ABSTRACT

The present application discloses a semiconductor device and a manufacturing method thereof. The manufacturing method comprises manufacturing a semiconductor material layer comprising two laminated semiconductor layers between which an etching transition layer is provided; and etching a part of one of semiconductor layers located in a selected region until etching is stopped after reaching or entering the etching transition layer, subjecting the part of the etching transition layer located in the selected region to thermal decomposition through thermal treatment to be completely removed, and realizing termination of thermal (Continued)

decomposition on another semiconductor layer, so as to precisely form a trench structure in the semiconductor material layer. The present application can achieve precise control of the depth of the trench etched on the semiconductor material to thoroughly avoid surface damage caused by etching and ensure that the electrical characteristic of the device is not affected by fluctuation of the etching process.

5 Claims, 10 Drawing Sheets

(51) Int. Cl.
*H01L 29/20* (2006.01)
*H01L 29/205* (2006.01)
*H01L 29/417* (2006.01)
*H01L 29/423* (2006.01)
*H01L 29/66* (2006.01)

(52) U.S. Cl.
CPC ...... *H01L 29/205* (2013.01); *H01L 29/41766* (2013.01); *H01L 29/4236* (2013.01); *H01L 29/66462* (2013.01)

(56) References Cited

U.S. PATENT DOCUMENTS

2016/0197203 A1* 7/2016 Hu ..................... H01L 29/205 438/579
2017/0352752 A1 12/2017 Ozaki et al.

FOREIGN PATENT DOCUMENTS

| CN | 106158950 A | 11/2016 |
| CN | 104011867 B | 12/2016 |
| CN | 106548939 A | 3/2017 |
| CN | 107045975 A | 8/2017 |
| CN | 107316901 A | 11/2017 |
| CN | 108666359 A | 10/2018 |

* cited by examiner

SEMICONDUCTOR DEVICE AND MANUFACTURING METHOD THEREOF EMPLOYING AN ETCHING TRANSITION LAYER

CROSS REFERENCE TO THE RELATED APPLICATIONS

This application is the national phase entry of International Application No. PCT/CN2019/130362, filed on Dec. 31, 2019, which is based upon and claims priority to Chinese Patent Application No. 201910388910.4, filed on May 10, 2019, the entire contents of which are incorporated herein by reference.

TECHNICAL FIELD

The present application relates to a manufacture process of a semiconductor device, and particularly to a semiconductor device based on a trench-gate technology and a manufacturing method thereof.

BACKGROUND

Compared with the traditional silicon-based metal oxide semiconductor field effect transistor (MOSFET), a high-electron-mobility transistor (HEMT) based on an AGaN/GaN heterojunction has the unique advantages of low on-resistance, high breakdown voltage, high switching frequency and the like, thus can be used as a core device in various electric power conversion systems and has an important application prospect in the aspect of energy conservation and consumption. However, due to the polarization effect of the group III nitride material system, in general, HEMT based on the AGaN/GaN heterojunction is of depletion type (normally open). When this type of devices are applied to circuit level systems, it is needed to design a negative polarity gate drive circuit to achieve the on-off control of the device, which greatly increases the complexity and cost of the circuit. In addition, the depleted devices have the defects in the aspect of failure and safety capability, and therefore cannot be truly and commercially applied.

The manufacture of enhanced HEMT based on a trench-gate technology is a relatively simple solution, that is, on the basis of the traditional HEMT epitaxial structure, a part of an AlGaN barrier layer in the region below the gate is etched in the device process. When the barrier layer is thinned to a certain extent, the two-dimensional electron gas in the gate region is exhausted; and the concentration of the two-dimensional electron gas in the region between a gate source and a gate drain is maintained at the original level, as shown in FIG. 1. However, it is difficult to achieve the accurate control of the etching depth in the process of trench gate etching, and the process repeatability is poor. A key parameter threshold voltage in the enhanced HEMT is closely related to the thickness of the non-etched barrier layer. Therefore, the resulting direct consequence is that the controllability and uniformity of the threshold voltage are both poor. In addition, in the etching process, inevitable etching damage (such as nitrogen vacancy and dangling bond) is caused on the surface of the barrier layer in the trench gate region, a large number of surface/interface states are generated, and the electric leakage of the gate is enlarged, thereby leading to reduction in regulation and control capability of the gate. Another feasible solution is based on a p-type gate technology, that is, on the basis of the traditional HEMT epitaxial structure, the energy band structure of the gate region is changed through the p-type layer of the gate region, the two-dimensional electron gas at the channel is effectively exhausted, and the typical device structure is as shown in FIG. 2. However, the p-type gate technology also involves the key technology namely trench gate etching, and thus is also faced with the problems of difficult control of trench gate etching depth, surface etching damage and the like.

Accordingly, the two existing technologies mentioned above are used to manufacture the enhanced HEMT. On the one hand, high requirements for the etching depth control of the barrier layer are put forward, which greatly increases the implementation difficulty and difficultly ensures the repeatability (between pieces), uniformity (between different regions in the piece) and stability (between different batches of processes) of this technology; on the other hand, the etching damage can create a series of gate reliability problems.

In order to overcome the difficulty of accurate and controllable etching depth, a digital oxidation/wet etching technology is proposed, that is, high-precise etching of the barrier layer is achieved by oxidizing the barrier layer, corroding the oxidization layer with acid solution and cycling. However, because the etching depth of each cycle is almost single atomic layer, many cycles are only needed to complete the whole etching process, thus this technology is low in efficiency and not conducive to large-scale mass production. Another simple method is that the etching depth of trench gate is controlled through low-speed etching such as reduction of low RF Power and reduction of Source Power in combination with etching time control, but it is at the cost of long etching time, and sensitively depends on the state of the etching equipment, and often generates the abnormity caused by the drifting of etching rate. In addition, it is also a feasible solution to use the appropriate etching gas to induce the formation of a corrosion-resistant layer on the surface in the etching process and achieve the etching termination. However, the surface etching damage is still inevitable, and subsequent surface treatment is needed to remove the etching damage layer.

In order to weaken the influence caused by the poor controllability of the trench gate etching depth, it is also generally needed to make some special improvements on the structure of the device. A kind of important trench gate enhanced device structures is MIS channel HEMT whose basic feature is to etch the trench gate to the GaN channel layer to form the characteristic of an enhanced MIS field effect transistor in a metal-medium-semiconductor structure. At the same time, gate metal extends on the dielectric layer to be over the barrier layer/channel layer heterojunction outside the trench gate to form depleted HEMT integrated with the enhanced MIS field effect transistor so as to enlarge the output current of the device. However, this technology inevitably has the difficulty of precisely etching the barrier layer, and the surface damage of the channel layer induced by etching can worsen the channel electron mobility, thus affecting the open-state resistance characteristic of the device.

SUMMARY

The main object of the present application is to provide a semiconductor device based on a trench gate technology as well as a manufacturing method and application thereof to overcome the defects of the prior art.

In order to achieve the object of the above disclosure, the technical solution adopted by the present application includes:

Some embodiments provide a manufacturing method of a semiconductor device, comprising:

A manufacturing method of a semiconductor device, comprising:

manufacturing and forming a semiconductor material layer comprising two laminated semiconductor layers between which an etching transition layer is provided; and etching a part of one of semiconductor layers located in a selected region until etching is stopped after reaching or entering the etching transition layer, and then completely removing the part of the etching transition layer located in the selected region through thermal treatment, thereby forming a trench structure in the semiconductor material layer.

Some embodiments also provide a manufacturing method of a semiconductor device, comprising:

manufacturing and forming a semiconductor material layer comprising a heterojunction, in which a two-dimensional electron gas is formed, especially consisting of a first semiconductor layer and a second semiconductor layer, and manufacturing a source, a drain and a gate which are matched with the semiconductor material layer.

Further, the manufacturing method further comprises:

growing a third semiconductor layer and a fourth semiconductor layer on the first semiconductor layer in sequence so as to form a second semiconductor layer, and setting the etching transition layer between the third semiconductor layer and the fourth semiconductor layer; and etching a part of the fourth semiconductor layer located in the selected region which corresponds to at least one of the gate, the source and the drain, until etching is stopped after reaching or entering the etching transition layer, and then completely removing the part of the etching transition layer located in the selected region through thermal treatment, thereby forming a trench structure matched with at least one of the gate, the source and the drain in the second semiconductor layer.

More further, the manufacturing method specifically comprises: subjecting the part of the etching transition layer located in the selected region to thermal decomposition through thermal treatment to be completely removed, and realizing termination of thermal decomposition on the third semiconductor layer so as to precisely form a trench structure matched with at least one of the gate, the source and the drain in the second semiconductor material layer, wherein the third semiconductor should have high thermal stability.

In some embodiments, the manufacturing method further comprises: after the trench structure matched with the gate is formed in the second semiconductor layer, at least cladding an dielectric layer on the inner wall of the trench structure matched with the gate, and then manufacturing the gate so that the dielectric layer is spaced between the gate and the third semiconductor.

In some embodiments, the manufacturing method further comprises: after the trench structure matched with the gate is formed, directly conducting secondary epitaxial growth on the semiconductor material layer to form a fifth semiconductor layer.

In some more particular embodiments, the manufacturing method further comprises: after the trench structure matched with the gate is formed, at least growing the fifth semiconductor layer in the trench structure matched with the gate, and then manufacturing the gate so that the fifth semiconductor layer is spaced between the gate and the third semiconductor layer, the fifth semiconductor layer being capable of exhausting two-dimensional electron gas inside the heterojunction located in the region under the gate.

Some embodiments also provide the semiconductor device manufactured by any one method of the present application.

Compared with the prior art, the present application at least has the advantages that on the one hand, precise control of the depth of the trench etched on the semiconductor material can be achieved; on the other hand, surface damage caused by etching can be thoroughly avoided, and the pyroprocess can sufficiently clean the surface of the lower barrier layer and fully open the dangling bond, so as to obtain a high-quality interface in the subsequent process, and then ensure that the electrical characteristics of the device are not influenced by fluctuation of the etching process.

DETAILED DESCRIPTION OF THE EMBODIMENTS

Figure 1:
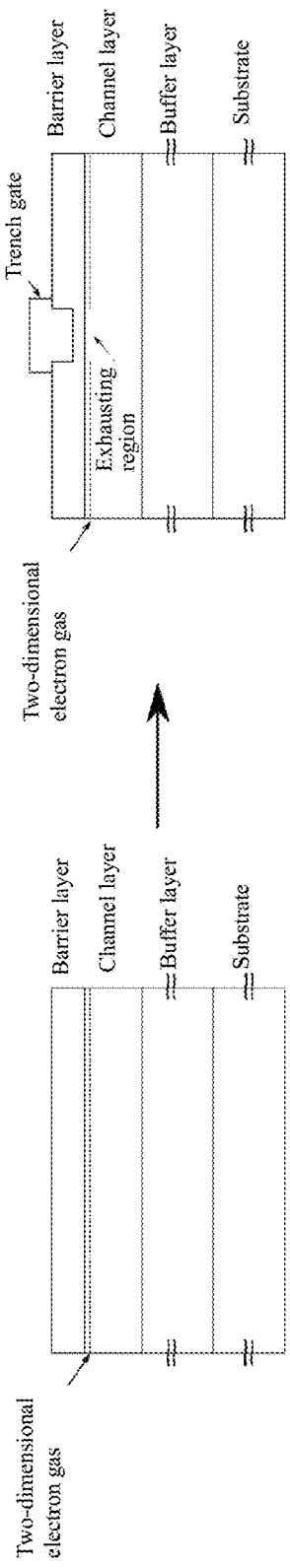
FIG. 1 is a schematic diagram of enhanced HEMT manufactured based on a trench gate technology in the prior art.
Figure 2:
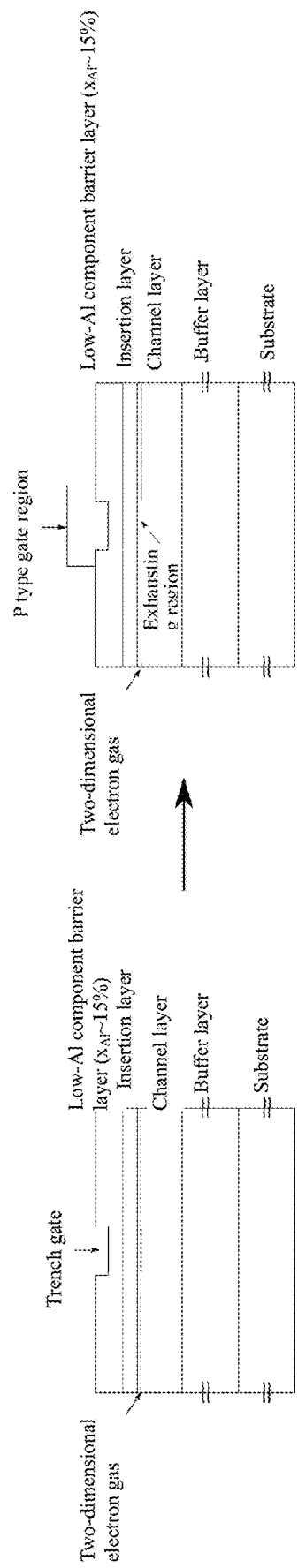
FIG. 2 is a schematic diagram of enhanced HEMT manufactured based on a p-type gate technology in the prior art.

As mentioned above, in view of the shortcomings of the prior art, the inventor of this case put forward the technical solution of the present application via a lot of researches and practices, and mainly provides a precise and undamaged method for forming a trench structure in a semiconductor device. Generally speaking, the technical solution provided by the embodiment of the present application is that at least one etching transition layer is grown in the epitaxial structure (semiconductor material layer), etched to the etching transition layer by dry etching and other processes, and then the etching transition layer is completely removed through thermal treatment process, while the semiconductor material structure layer located under the etching transition layer has better thermal stability, the thermal decomposition process will stop on the surface of the semiconductor structure layer under suitable conditions and atmosphere and a series of beneficial effects are achieved. For example, when the technical solution of the embodiment of the present application is applied to the manufacture of core structures of GaN-based enhanced HEMT and other devices, on the one hand, controllable manufacture of trench gate can be achieved and meanwhile controllable manufacture of a trench type source-drain ohmic contact structure can be realized so that ohmic contact can be manufactured under the condition of low-temperature annealing, and the compatibility of the device manufacture process has more flexibility; on the other hand, the surface damage caused by etching can be thoroughly avoided, and the pyroprocess can sufficiently clean the surface of the lower barrier layer and fully open the dangling bond, so as to obtain a high-quality interface in the subsequent process, finally ensure the process stability of the gate region, and the electrical characteristics, including threshold voltage, gate current and the like, of the device are not influenced by fluctuation of the etching process to the greatest extent, the control manufacture of the trench gate structure is realized, so as to guarantee the repeatability, uniformity and stability of the process. The technical solution of the embodiment of the present application is suitable for mass production.

Moreover, the technical solution provided by the embodiment of the present application is not just limited to manufacturing the trench gate, and also manufacturing trench type low-temperature ohmic contact with process compatibility, is also applicable to other occasions where etching self-termination is required on the premise of ensuring process compatibility. For example, the technical solution can be used for manufacturing enhanced HEMT based on MIS structure and p-GaN gate, as well as a monolithic integrated structure based on depleted HEMT and enhanced HEMT, or other diode structures, including but not limited to MIS type diodes based on mixing anodes, diodes based on p-GaN gate, vertical structure diodes (Schottky and p-n diodes), and junction type barrier Schottky (JBS) and the like, other devices needing to use the trench structure and etching termination process, including but not limited to enhanced radio frequency/millimeter wave devices, and vertical and horizontal Trench MOSFET.

One aspect of an embodiment of the present application provides a manufacturing method of a semiconductor device, comprising:

manufacturing and forming a semiconductor material layer comprising two laminated semiconductor layers, an etching transition layer being formed between the two semiconductor layers; and etching a part of one of semiconductor layers located in a selected region until etching is stopped after reaching or entering the etching transition layer, and then completely removing the part of the etching transition layer located in the selected region through thermal treatment, thereby forming a trench structure in the semiconductor material layer.

Further, the manufacturing method specifically comprises:

subjecting the part of the etching transition layer located in the selected region to thermal decomposition through thermal treatment to be completely removed, and realizing termination of thermal decomposition on the surface of another semiconductor layer so as to precisely form a trench structure in the semiconductor material layer.

Wherein, the another semiconductor layer should have high thermal stability.

Another aspect of an embodiment of the present application provides a manufacturing method of a semiconductor device, comprising:

manufacturing and forming a semiconductor material layer comprising a heterojunction, in which a two-dimensional electron gas is formed, especially consisting of a first semiconductor layer and a second semiconductor layer, and manufacturing a source, a drain and a gate which are matched with the semiconductor material layer.

Wherein, the manufacturing method further comprises:

growing a third semiconductor layer and a fourth semiconductor layer on the first semiconductor layer in sequence so as to form a second semiconductor layer, and setting the etching transition layer between the third semiconductor layer and the fourth semiconductor layer; and etching a part of the fourth semiconductor layer located in the selected region which corresponds to at least one of the gate, the source and the drain, until etching is stopped after reaching or entering the etching transition layer, then subjecting the part of the etching transition layer located in the selected region to thermal decomposition through thermal treatment to be completely removed, and realizing termination of thermal decomposition on the third semiconductor layer, so as to form a trench structure matched with at least one of the gate, the source and the drain in the second semiconductor layer.

In some particular embodiments, the manufacturing method further comprises: after the trench structure matched with the gate is formed in the second semiconductor layer, at least cladding a dielectric layer on the inner wall of the trench structure matched with the gate, and then manufacturing the gate so that the dielectric layer is spaced between the gate and the third semiconductor.

In some more particular embodiments, the manufacturing method further comprises:

etching the parts of the semiconductor material layers located in the regions which correspond to the source, the drain and the gate until etching is stopped after reaching or entering the etching transition layer, and then completely removing the parts of the etching transition layer located in the regions which correspond to the source, the drain and the gate through thermal treatment, thereby forming trench structures respectively matched with the source, the drain and the gate in the semiconductor layer;

cladding a dielectric layer on the semiconductor material layer, the dielectric layer at least continuously covering the trench walls of the trench structures matched with the source, the drain and the gate;

providing windows for allowing the source and the drain to pass on the dielectric layer; and manufacturing the source, the drain and the gate.

In some particular embodiments, the manufacturing method further comprises: after the trench structure matched with the gate is formed, directly conducting secondary epitaxial growth on the semiconductor material layer to form a fifth semiconductor layer.

In some particular embodiments, the manufacturing method further comprises: after the trench structure matched with the gate is formed, at least growing the fifth semiconductor layer in the trench structure matched with the gate and then manufacturing the gate so that the fifth semiconductor layer is spaced between the gate and the third semiconductor layer, the fifth semiconductor layer being capable of exhausting two-dimensional electron gas inside the heterojunction located in the region under the gate.

In some more particular embodiments, the manufacturing method further comprises:

etching a part of the semiconductor material layer located in the region which corresponds to the gate, until etching is stopped after reaching or entering the etching transition layer, then subjecting the part of the etching transition layer located in the region which corresponds to the gate to thermal decomposition through thermal treatment to be completely removed, and realizing termination of thermal decomposition on the third semiconductor layer, thereby forming the trench structure matched with the gate in the second semiconductor layer;

growing a fifth semiconductor layer on the semiconductor material layer, and filling the part of the fifth semiconductor layer into the trench structure matched with the gate;

removing the other parts of the fifth semiconductor layer, and retaining the part of the fifth semiconductor layer located in the region matched with the gate;

cladding a continuous passivation layer on the semiconductor material layer;

providing windows for allowing the source, the drain and the gate to pass on the passivation layer;

providing windows for allowing the source and the drain to pass on the passivation layer and etching the semiconductor material layer, until etching is stopped after reaching or entering the etching transition layer, then subjecting the parts of the etching transition layer located in the regions which correspond to the source, the drain and the gate to thermal decomposition through thermal treatment to be completely removed, and realizing termination of thermal decomposition on the third semiconductor layer, thereby forming the trench structures matched with the source, the drain and the gate in the second semiconductor layer;

manufacturing the source, the drain and the gate;

wherein, the third semiconductor layer should have high thermal stability.

In some particular embodiments, the manufacturing method further comprises: allowing the source and the drain to form ohmic contact with the third semiconductor layer.

Further, the semiconductor material layer further comprises a cap layer formed on the fourth semiconductor layer.

Figure 3:
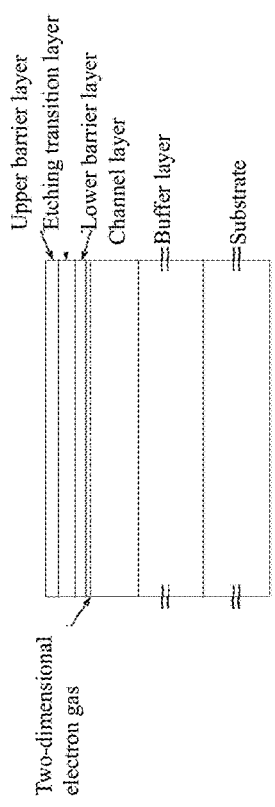
FIG. 3 is a diagram of an epitaxial structure of HEMT in a typical embodiment of the present application.
Figure 3:
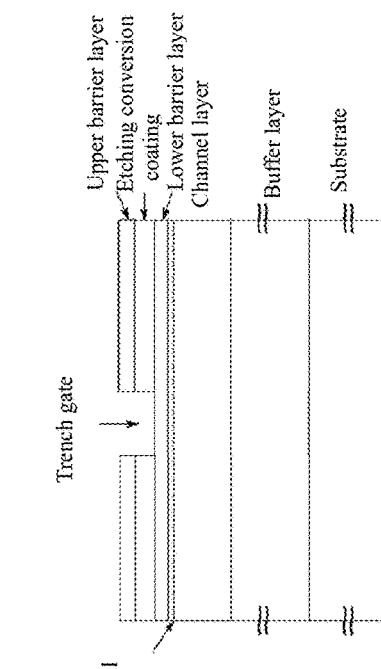
Figure 4:
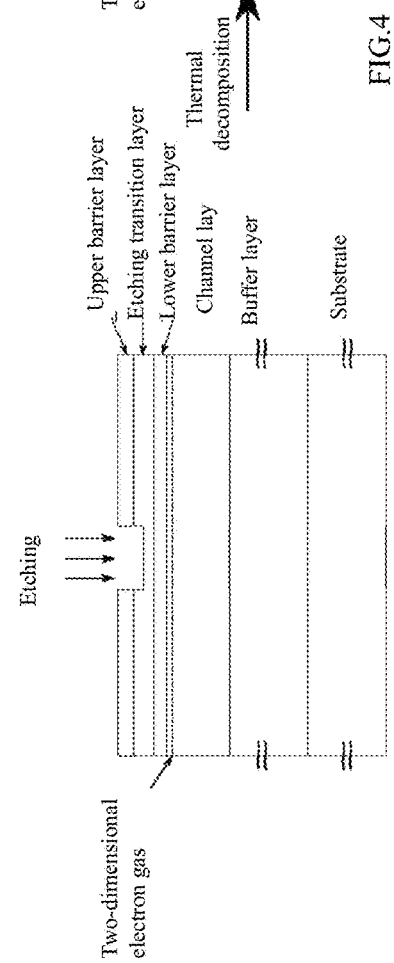
FIG. 4 is a diagram of an HEMT manufacturing principle in a typical embodiment of the present application.

For example, in a typical embodiment, it is needed to manufacture an HEMT device whose epitaxial structure includes a buffer layer, a channel layer and a composite barrier layer formed on a substrate, wherein an etching transition layer is inserted in the composite barrier layer structure (so the structure of the composite barrier layer is: upper barrier layer/etching transition layer/lower barrier layer, as shown in FIG. 3), which is etched to the etching transition layer (such as GaN) through dry etching, and the thermal treatment process is further used to completely remove the etching transition layer. Because the lower barrier layer has better thermal stability, the thermal decomposition process will stop on the surface of the lower barrier layer under suitable conditions and atmosphere, as shown in FIG. 4. Wherein, the lower barrier layer is usually AlGaN or AlN containing Al, and the Al—N bond energy is significantly higher than Ga—N bond energy. Under suitable conditions and atmosphere, the lower barrier layer has good thermal stability. In this way, not only the precise control of the trench gate depth can be realized, but also the surface damage caused by etching can be completely avoided, and the pyroprocess can sufficiently clean the surface of the lower barrier layer, and fully open the dangling bond, so as to obtain a high-quality interface in the subsequent process, ensure the process stability of the gate region, and then ensure that the electrical characteristics, including threshold voltage and gate current, of the device are not influenced by the etching process to realize the controllable manufacture of the trench gate structure.

Another aspect of the embodiment of the present application also provides a semiconductor device manufactured by any one method of the present application.

In the embodiment of the present application, the materials of the above-mentioned etching transition layer include GaN and other materials that can realize thermal decomposition after dry etching, such as InGaN, inN, or AlGaN, AlInN, AlInGaN and the like which contain low Al component, but are not limited thereto.

In the embodiment of the present application, the above-mentioned semiconductor device can be a high electron mobility transistor (HEMT) or other semiconductor devices. If it is HEMT, the material of the heterojunction barrier layer can include, but is not limited to, a AlGaN-based material, a AlInN-based material, a AlInGaN-based material or the like. Further, if it is HEMT, the thickness of each layer in the composite barrier layer (namely the second semiconductor layer) can be adjusted on the premise of ensuring that the two-dimensional electron gas has excellent electrical characteristics and a wide etching process window, and Al, In and Ga components can be various functions of the epitaxial growth direction.

In the embodiment of the present application, on the premise of realizing the self termination of the thermal decomposition process, equipment for implementing heat treatment can adopt MOCVD equipment, but various other heating equipment, heating methods and heating conditions are also applicable.

In the embodiment of the present application, the manufacturing process of the above-mentioned semiconductor device can also comprise other possible process steps, including thickening the passivation layer and field plate structure, thickening the interconnection electrode, but is not limited thereto.

In the embodiment of the present application, the heat treatment procedure is not limited to realizing self termination of the thermal decomposition process, but also suitable for a process for direct secondary epitaxy after the completion of self termination of the thermal decomposition process, such as epitaxial growth of thin layers GaN, AlGaN, AlN and the like, but not limited thereto, to obtain high-quality interfaces and surfaces.

In the embodiment of the present application, the material of the above-mentioned passivation layer includes $Al_2O_3$, AlN (aluminum nitride), SiN (silicon nitride), $SiO_2$, $Al_2O_3$ and AlON, but is not limited thereto.

In the embodiment of the present application, the etching technology used can be the dry etching technology, such as ICP etching technology or other dry etching technologies, to perform trench gate etching, trench type ohmic contact etching and the like.

In the embodiment of the present application, the semiconductor device can also include a substrate whose material can be silicon, sapphire, silicon carbide, gallium nitride, aluminum nitride or the like, and is not limited thereto.

The technical solution of the present application will be explained more specifically in combination with several embodiments and the accompanying drawings. In the following examples, metal organic vapor deposition (MOCVD) is used and other systems use controllable thermal decomposition technology to prepare the trench gate structure is manufactured by utilizing metal organic vapor deposition (MOCVD) and other systems through the controllable thermal decomposition technology, that is, when the barrier layer is grown, the epitaxial growth includes the epitaxial structure of the etching transition layer. Combined with the dry etching process, the etching termination of the trench gate structure is effectively and reliably realized, so as to precisely control the etching depth of the trench gate and meanwhile avoid the etching damage caused by dry etching, and the like. However, the various product structure parameters, various reaction participants and process conditions used in the following examples are all typical examples. However, after the inventor of this case conducts a large number of tests and verifications, other different structure parameters, other types of reaction participants and other process conditions listed above are also applicable and can all reach the technical effect claimed in the present application.

Figure 5:
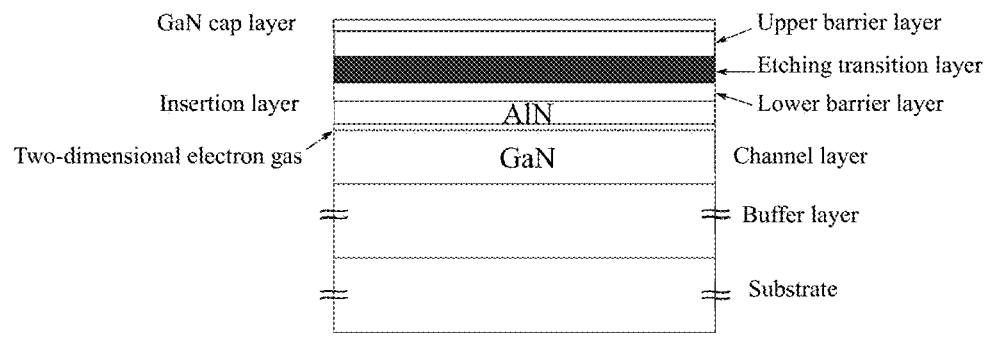
FIG. 5 is a diagram of an epitaxial structure of HEMT based on a composite barrier layer in example 1 of the present application.
Figure 6:
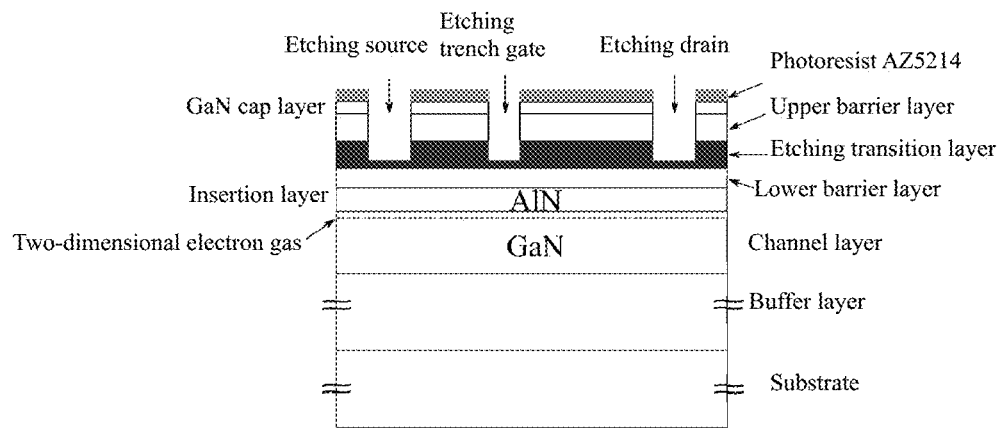
FIG. 6 is a diagram of gate, source and drain regions of an epitaxial structure shown in FIG. 1 after ICP etching to an etching transition layer.
Figure 7A:
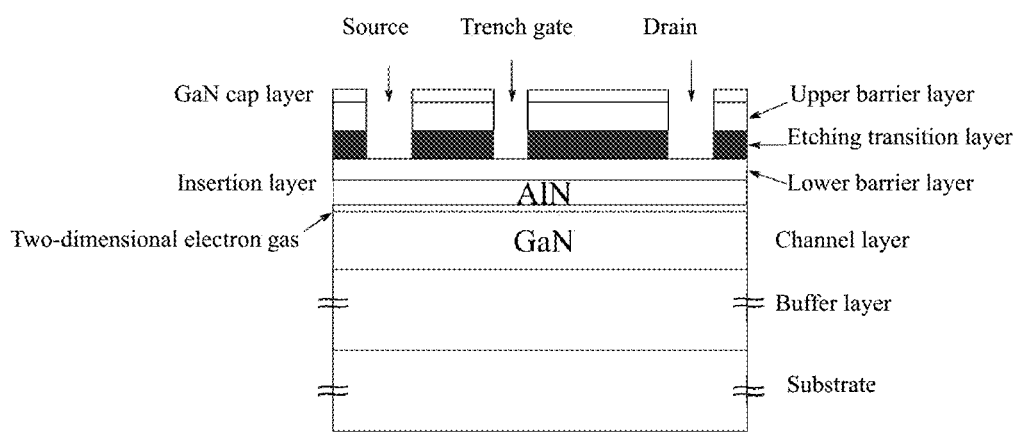
FIG. 7A is a diagram of a device structure shown in FIG. 6 after MOCVD thermal decomposition treatment.
Figure 7B:
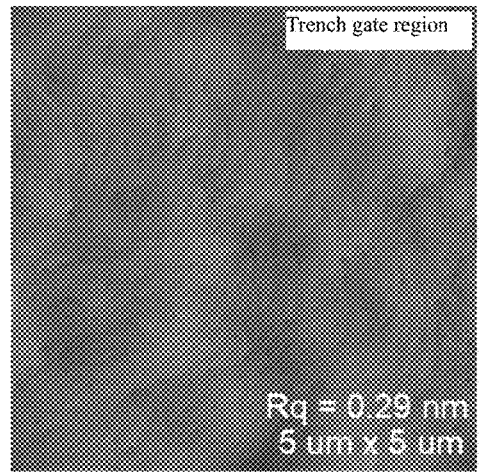
FIG. 7B shows that a clear step stream morphology of a trench surface is restored after thermal decomposition of a device structure shown in FIG. 7A is terminated.
Figure 7C:
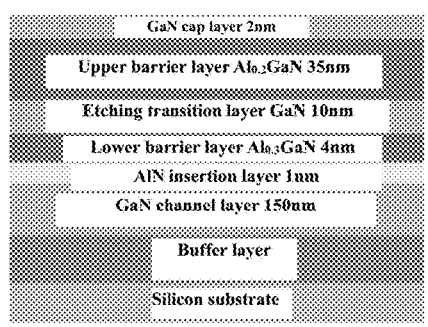
FIG. 7C and FIG. 7D are diagrams of trench depth and uniformity of a gate region after the device structure shown in FIG. 7A is subjected to etching and thermal decomposition.
Figure 7D:
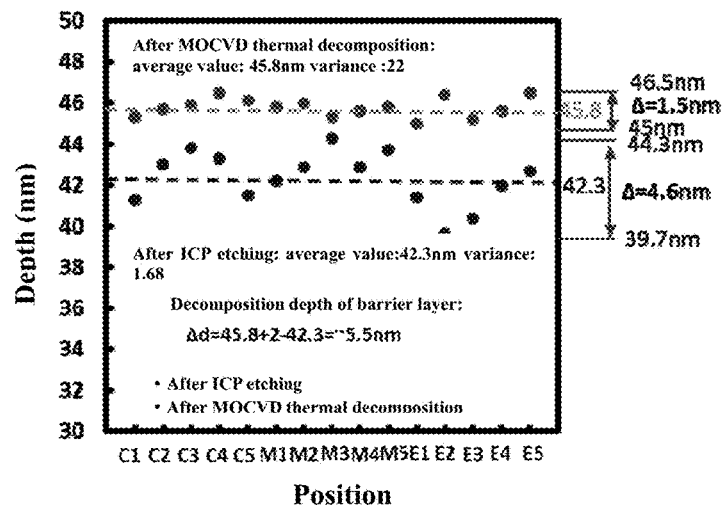
Figure 8:
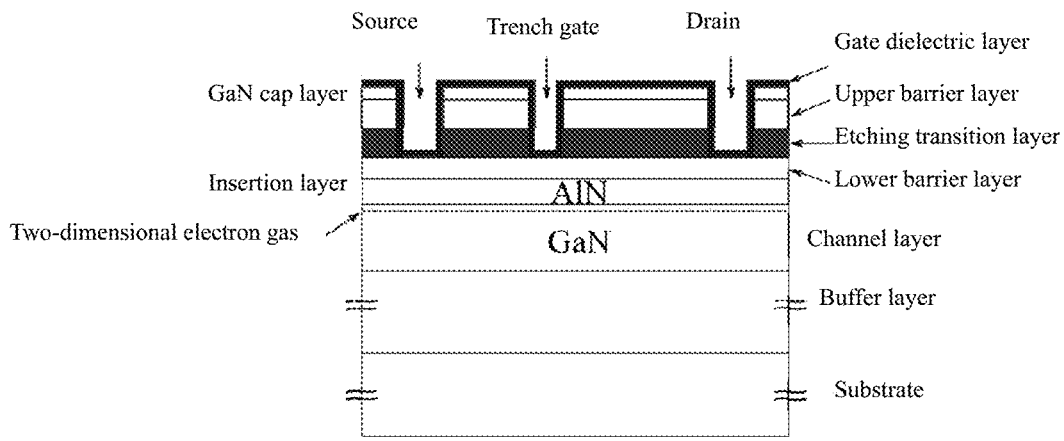
FIG. 8 is a diagram after a gate dielectric layer is deposited on the device structure shown in FIG. 7A.
Figure 9:
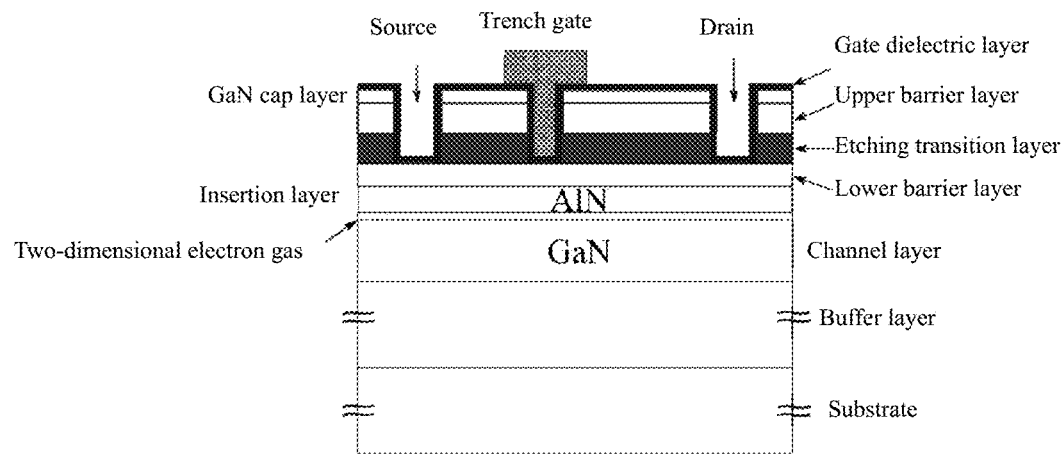
FIG. 9 is a diagram after gate metal is deposited on the device structure shown in FIG. 8.
Figure 10:
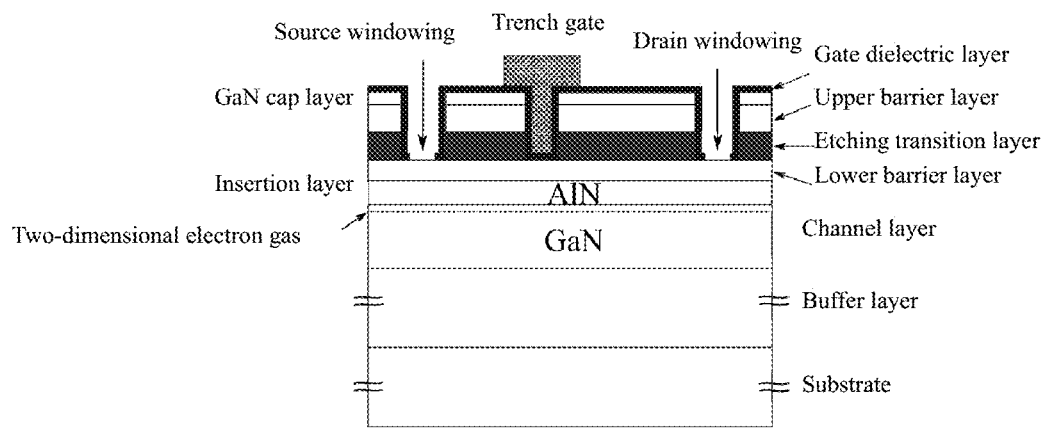
FIG. 10 is a diagram after source and drain ohmic contacts and windowing are carried out on the device structure shown in FIG. 9.
Figure 11:
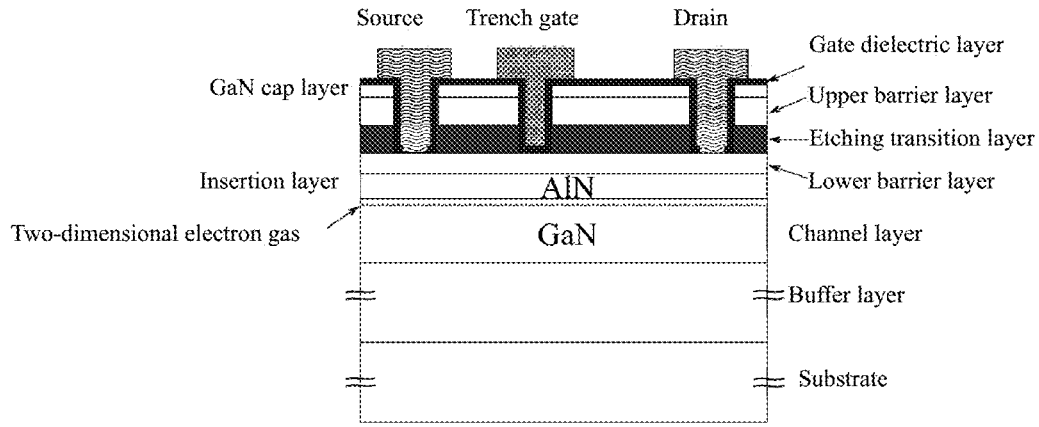
FIG. 11 is a diagram after source and drain ohmic contacts are manufactured on the device structure shown in FIG. 10.
Figure 12:
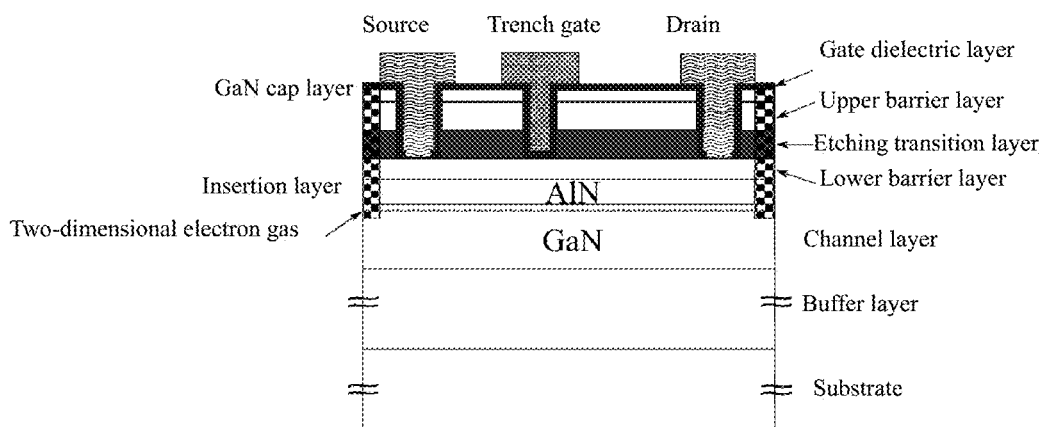
FIG. 12 is a diagram after active region isolation is carried out on the device structure shown in FIG. 11.

Example 1: The manufacture method of enhanced HEMT based on an MIS structure provided by this example includes the following steps:
1) MOCVD epitaxial growth is based on HEMT of composite barrier layer heterojunction, wherein the upper barrier layer is $Al_{0.2}Ga_{0.8}N$, and has a thickness of about 35 nm; the etching transition layer is GaN and has a thickness of about 10 nm; the lower barrier layer is $Al_{0.3}Ga_{0.7}N$ and has a thickness of about 2-4 nm; the GaN cap layer has a thickness of about 2 nm; the AlN insertion layer has a thickness of about 1 nm; the GaN channel layer has a thickness of 50-200 nm. The HEMT epitaxial structure is as shown in FIG. 5.
2) upper barrier layers and etching transition layers of a gate, a source and a drain are etched by using an inductive coupled plasma (ICP) etching technology with photoresist AZ5214 as a mask (or the upper barrier layer and the etching transition layer in the gate region are only etched), the etching rate is controlled as 1-20 nm/min. After etching to GaN etching transition layer, etching is stopped, that is, by controlling the etching time, the etching process has reached GAN etching transition layer, and a certain etching time window is utilized to ensure that the GaN etching transition layer is not completely etched, as shown in FIG. 6.
3) Epitaxial wafers (without photoresist), which are subjected to ICP etching, in the gate, source and drain regions (or only gate region) are put into MOCVD chambers. The rest GaN etching transition layers subjected to surface etching are completely thermally decomposed through heating treatment, and the thermal decomposition process is terminated on the $Al_{0.3}Ga_{0.7}N$ lower barrier layer, as shown in FIG. 7A. After the thermal decomposition is terminated, the clear step stream morphology of the trench surface is restored, as shown in FIG. 7B, and the trench depth and uniformity of the gate region after etching and thermal decomposition are shown in FIG. 7C and FIG. 7D. In the process of heat treatment, $N_2/NH_3$ mixing atmosphere is used, the temperature range is 500-1200° C., and the heat treatment time is 1-15 min. After the thermal decomposition of GaN etching transition layer is completed, the subsequent dielectric deposition can be directly carried out, or thin layers GaN, AlGaN or AlN can be grown by secondary epitaxy according to the needs, and the interface is buried below.
4) Deposition of gate dielectric layer. The deposition of the composite gate dielectric $Al_2O_3$/AlN is carried out by adopting an ALD (atomic layer deposition) technology, wherein the thickness of AlN is 1-10 nm and the thickness of $Al_2O_3$ is 2-50 nm, as shown in FIG. 8. Further, the post-annealing process is carried out in $N_2$ atmosphere, the annealing temperature is 600° C., and the annealing time is 3 min.
5) Deposition of gate metal. An electron beam evaporation technology is used, the manufacture conditions are as follows: Metal Ni/Au, the thickness is 50 nm/250 nm, as shown in FIG. 9.
6) Source-drain ohm contact windowing. The photoresist AZ5214 is used as the mask (1-2 μm), through the plasma etching (in this embodiment, the chlorine containing plasma etching composite gate dielectric layer $Al_2O_3$/AlN), source-drain ohmic contact windowing is realized by using the photoresist AZ5214 is used as the mask (1-2 μm) through plasma etching (in this example, the composite gate dielectric layer $Al_2O_3$/AlN is etched using chlorine-containing plasma), as shown in FIG. 10.
7) Source-drain ohmic contact. The electron beam evaporation technology is used, the manufacture conditions are as follows: metal Ti/Al/Ni/Au, the thicknesses are 6 nm/120 nm/20 nm/30 nm. Annealing conditions are as follows: 550° C., 3 min, nitrogen atmosphere, as shown in FIG. 11.
8) Isolation of Active region. Isolation is carried out by using an N-ion implantation technology, the ion implantation energy is 150-400 KeV of ion implantation, the implanted ion dosage is $10^{12}$-$10^{14}$/cm$^2$, and the implantation depth exceeds a buffer layer by about 50-250 nm, as shown in FIG. 12.

Figure 13:
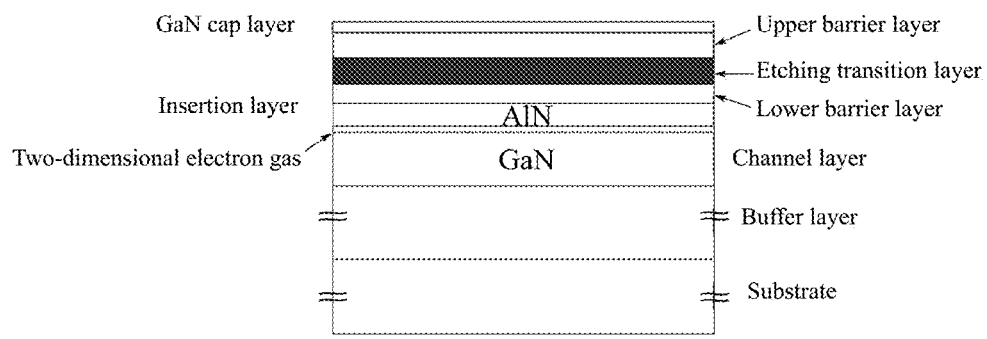
FIG. 13 is a s diagram of an HEMT epitaxial structure based on a composite barrier layer in example 2 of the present application.

Example 2: The manufacture method of enhanced HEMT based on a p-type gate structure provided by this example includes the following steps:
1) MOCVD epitaxial growth is based on HEMT of a composite barrier layer heterojunction, wherein the upper barrier layer is $Al_{0.2}Ga_{0.8}N$, and has a thickness of about 35 nm; the etching transition layer is GaN and has a thickness of about 10 nm; the lower barrier layer is $Al_{0.25}Ga_{0.75}N$ and has a thickness of about 15 nm; the GaN cap layer has a thickness of about 2 nm; the AlN insertion layer has a thickness of about 1 nm; the GaN channel layer has a thickness of 50-200 nm. The HEMT epitaxial structure is as shown in FIG. 13.

Figure 14A:
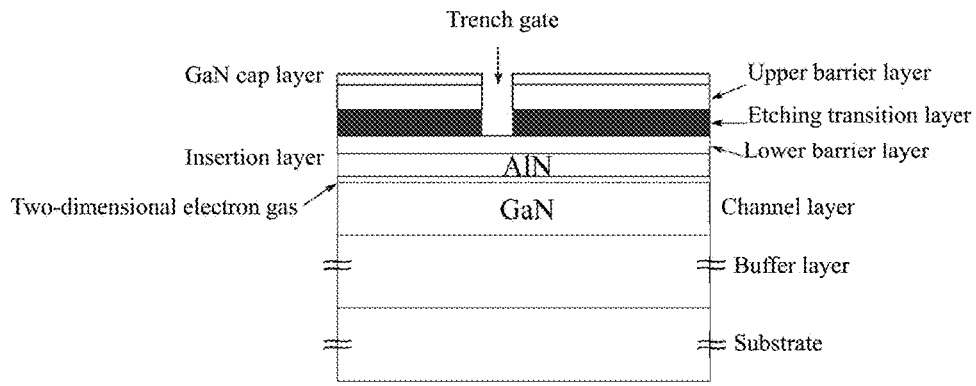
FIG. 14A is a diagram after an epitaxial structure shown in FIG. 13 is subjected to ICP etching and MOCVD thermal decomposition to form a trench gate structure.
Figure 14B:
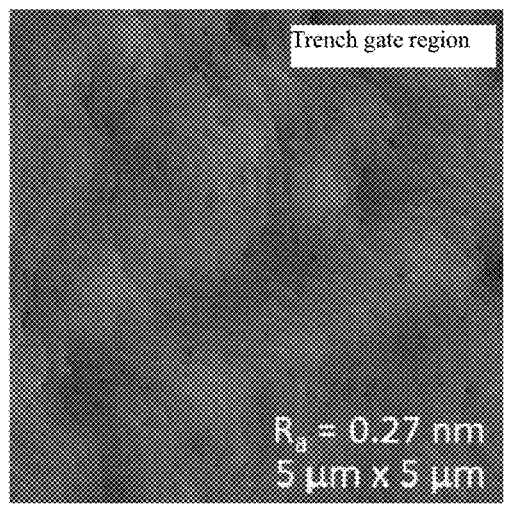
FIG. 14B shows a clear step stream morphology of a trench surface is restored after the thermal decomposition of the device structure shown in FIG. 14A is terminated.
Figure 14C:
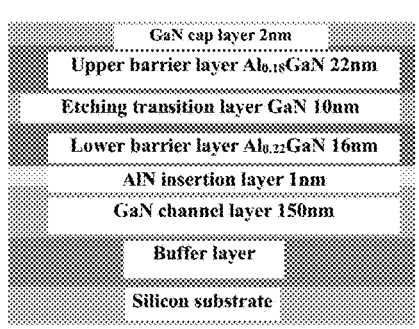
FIG. 14C and FIG. 14D are diagrams of trench depth and uniformity of the gate region after the device structure shown in FIG. 14A is subjected to etching and thermal decomposition.
Figure 14D:
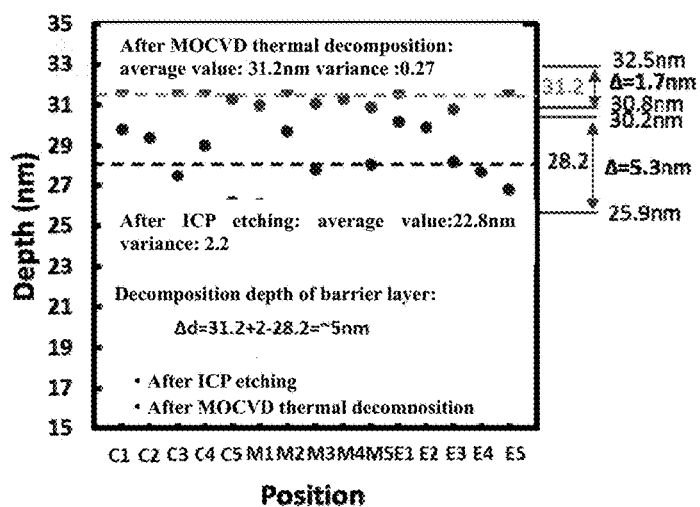

2) This step is the same as step 2)-3) in example 1. The upper barrier layer $Al_{0.25}Ga_{0.75}N$ and GaN etching transition layer in the gate region are only subjected to ICP etching, and MOCVD thermal decomposition is carried out on the rest GaN etching transition layers in the gate region and terminated on the lower barrier layer $Al_{0.25}Ga_{0.75}N$, as shown in FIG. 14A. After thermal decomposition is terminated, the clear step stream morphology of the trench surface is restored, as shown in FIG. 14B, and the trench depth and uniformity in the gate region after etching and thermal decomposition are shown in FIG. 14C and FIG. 14D.

Figure 15:
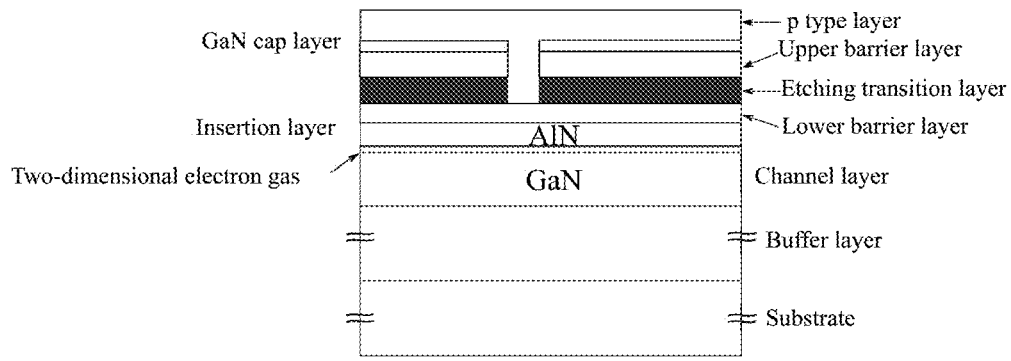
FIG. 15 is a diagram after the device structure shown in FIG. 14A is subjected to MOCVD thermal decomposition to form a trench gate structure and then secondary epitaxy of a p-type layer is directly carried out.

3) Secondary growth of p-type layer. The p-type layer is subjected to MOCVD epitaxial growth, the thickness of p-GaN is 5-300 nm, and the range of Mg-doping concentration is $10^{18}$-$10^{21}$/cm$^3$ order, as shown in FIG. 15.

Figure 16:
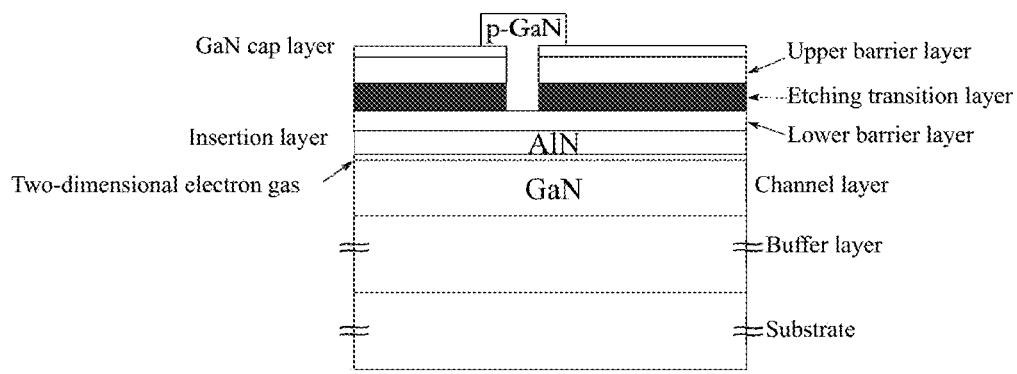
FIG. 16 is a diagram after the p-type layer in the non-gate region of the device structure shown in FIG. 15 is etched.

4) Etching of a p-type layer in a non-gate region. The p-type layer in the non-gate region is etched by using the ICP etching technology, as shown in FIG. 16.

Figure 17:
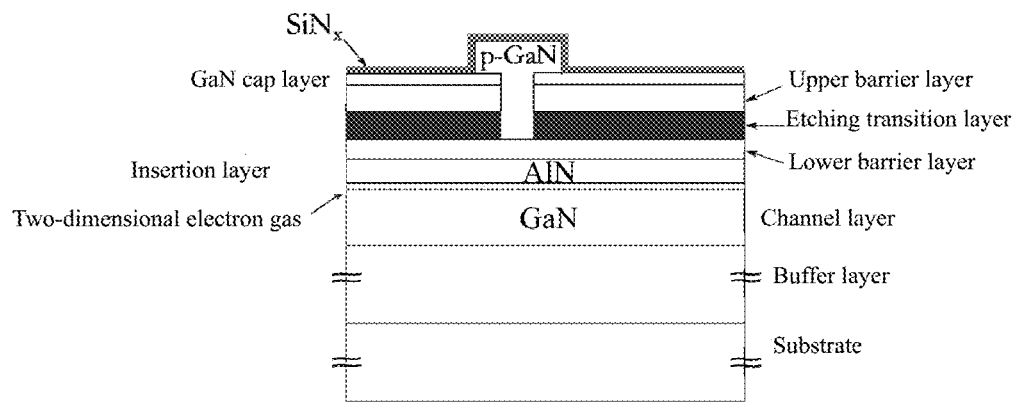
FIG. 17 is a diagram after a passivation layer is deposited on the device structure shown in FIG. 16.

5) Deposition of passivation layer. Through LPCVD (low pressure chemical vapor deposition) dielectric layer deposition technology, a SiNx passivation layer is deposited, with a thickness of 10-500 nm, as shown in FIG. 17.

Figure 18:
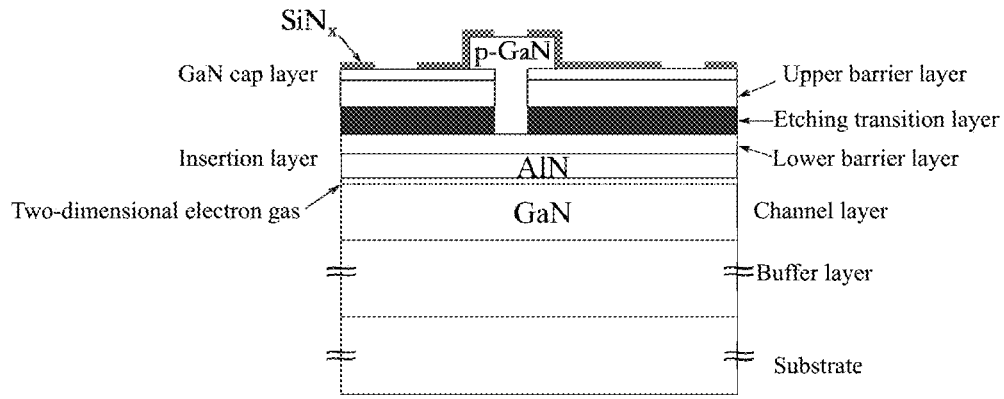
FIG. 18 is a diagram after the passivation layer on the device structure shown in FIG. 17 is windowed.

6) Passivation layer windowing. SiNx is etched through fluorine-based RIE (reactive ion etch) to realize source-drain ohmic contact and gate windowing, as shown in FIG. 18. Further, a wet treatment process for surface etching damage and a high temperature annealing process are carried out, the annealing conditions are as follows: 700-950° C., 1-5 min and nitrogen atmosphere.

Figure 19:
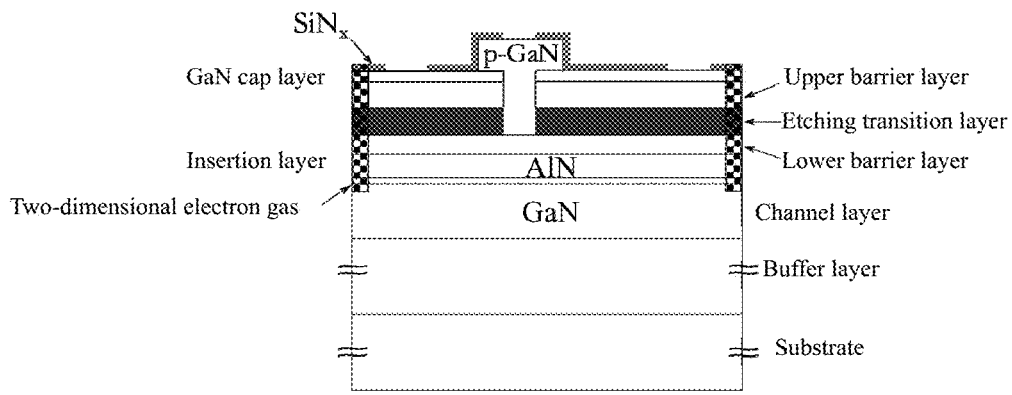
FIG. 19 is a diagram after the device structure shown in FIG. 18 is subjected to active region isolation.

7) Isolation of active region. Isolation is carried out using the N-ion implantation technology. The ion implantation energy is 150-400 keV of ion implantation, the implanted ion dosage is $10^{12}$-$10^{14}$/cm$^2$, and the implantation depth exceeds the buffer layer by about 50-250 nm, as shown in FIG. 19.

Figure 20:
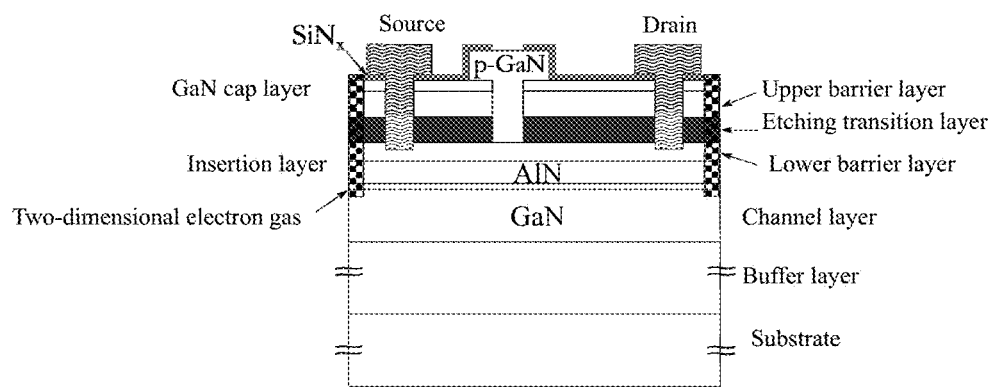
FIG. 20 is a diagram after trench type source-drain ohmic contact is manufactured on the device structure shown in FIG. 19.

8) Trench type source-drain ohmic contact. Trench etching is carried out in source and drain regions by adopting ICP etching and using photoresist AZ5214 as the mask, and the etching rate is controlled as 1-20 nm/min. By controlling the etching time, the thickness of 0-6 nm is left in the lower barrier layer. Metal Ti/Al/Ni/Au are deposited, with the thicknesses being 20 nm/130 nm/50 nm/150 nm, and the annealing conditions are as follows: 500-900° C., 0.5-5 min, nitrogen atmosphere, as shown in FIG. 20.

Figure 21:
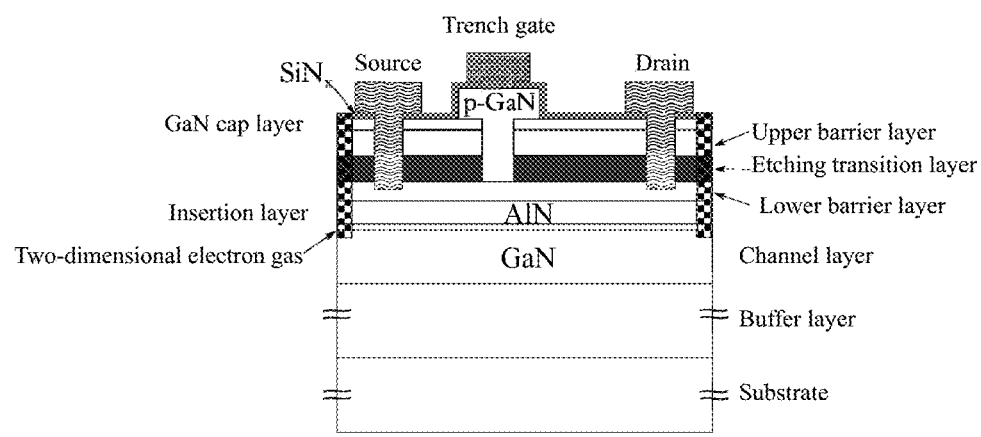
FIG. 21 is a diagram after gate metal is deposited on the device structure shown in FIG. 20.

9) Deposition of gate metal. Deposition of Pd/Pt/Au is carried out by magnetron sputtering, with the thicknesses being 30 nm/30 nm/50 nm, and the post-annealing conditions are as follows: 500° C., 1 min, nitrogen atmosphere, as shown in FIG. 21.

The above examples of the present application can effectively solve the problem of self-termination etching in the manufacturing process of the semiconductor device by combining dry etching and the heat treatment process through the epitaxial growth of the composite epitaxial structure including the etching transition layer, can greatly improve the uniformity problems of the trench depth on the wafer, including the manufacture of the trench gate structure and the manufacture of the trench type source-drain ohmic contact, and furthermore completely avoids that the problem that damage is caused by the traditional dry etching, thereby significantly improving the performances and uniformity of the enhanced HEMT and the like. It should be noted that in this text, the terms "including", "comprising" or any other variations are intended to cover non-exclusive inclusion, so that processes, methods, articles or equipment including a series of elements include not only those elements, but also other elements that are not explicitly listed, or include elements inherent for such the processes, methods, articles or equipment. Without further restrictions, the element defined by a sentence "including a . . . " is not excluded in the process, methods, articles or equipment including the elements, and another identical elements are also present.

The above description is only specific embodiment of the present application. It should be pointed out that a person of ordinary skill in the art can make several improvements and modifications without departing from the principle of the present application, and these improvements and modifications are also deemed to be included within the protective scope of the present application.

What is claimed is:

1. A manufacturing method of a semiconductor device, comprising:
  manufacturing and forming a semiconductor material layer comprising a heterojunction, wherein a two-dimensional electron gas is formed in the heterojunction, and the heterojunction comprises a first semiconductor layer and a second semiconductor layer, wherein the manufacturing and forming comprises growing a third semiconductor layer and a fourth semiconductor layer on the first semiconductor layer in sequence so as to form the second semiconductor layer, and setting an etching transition layer between the third semiconductor layer and the fourth semiconductor layer; and
  etching parts of the semiconductor material layer, including a part of the fourth semiconductor layer, located in regions corresponding to a source, a drain and a gate, until the etching is stopped after reaching or entering the etching transition layer, then completely removing parts of the etching transition layer located in the regions corresponding to the source, the drain and the gate through thermal treatment, thereby forming trench structures respectively matched with the source, the drain and the gate;
  after the trench structure matched with the gate is formed in the second semiconductor layer, cladding a dielectric layer on the semiconductor material layer on an inner wall of the trench structure matched with the gate, wherein the dielectric layer at least continuously covers trench walls of the trench structures matched with the source, the drain and the gate;
  providing windows for allowing the source and the drain to pass on the dielectric layer; and
  manufacturing the source, the drain and the gate, wherein the source, the drain, and the gate are matched with the semiconductor material layer, and wherein the gate is manufactured so that the dielectric layer is spaced between the gate and the third semiconductor.

2. The manufacturing method according to claim 1, further comprising: allowing the source and the drain to form ohmic contact with the third semiconductor layer.

3. The manufacturing method according to claim 1, wherein the semiconductor material layer further comprises: a cap layer formed on the fourth semiconductor layer.

4. A manufacturing method of a semiconductor device, comprising:
manufacturing and forming a semiconductor material layer comprising a heterojunction, wherein a two-dimensional electron gas is formed in the heterojunction, and the heterojunction comprises a first semiconductor layer and a second semiconductor layer, wherein the manufacturing and forming comprises growing a third semiconductor layer and a fourth semiconductor layer on the first semiconductor layer in sequence so as to form the second semiconductor layer, and setting an etching transition layer between the third semiconductor layer and the fourth semiconductor layer;
etching a part of the fourth semiconductor material layer located in a selected region corresponding to the gate until the etching is stopped after reaching or entering the etching transition layer, then subjecting a part of the etching transition layer located in the region corresponding to the gate to thermal decomposition through thermal treatment so that the part of the etching transition layer located in the region corresponding to the gate is completely removed, and realizing termination of the thermal decomposition on the third semiconductor layer, thereby forming a trench structure matched with the gate in the second semiconductor layer;
after the trench structure matched with the gate is formed, directly conducting secondary epitaxial growth on the semiconductor material layer to form a fifth semiconductor layer such that the fifth semiconductor layer is grown in the trench structure matched with the gate;
filling partially the fifth semiconductor layer into the trench structure matched with the gate;
removing the rest parts of the fifth semiconductor layer, and retaining the partial fifth semiconductor layer located in the region matched with the gate;
cladding a continuous passivation layer on the semiconductor material layer;
providing windows for allowing a source, a drain and the gate to pass on the passivation layer;
etching the semiconductor material layer from the windows until the etching is stopped after reaching or entering the etching transition layer, and then subjecting parts of the etching transition layer located in selected regions corresponding to the source and the drain to thermal decomposition through thermal treatment so that the parts of the etching transition layer located in the regions corresponding to the source and the drain are completely removed, and realizing termination of the thermal decomposition on the third semiconductor layer, thereby forming trench structures matched with the source and the drain in the second semiconductor layer; and
manufacturing the source, the drain and the gate, wherein the source, the drain, and the gate are matched with the semiconductor material layer, wherein the gate is manufactured such that the fifth semiconductor layer is spaced between the gate and the third semiconductor layer, and wherein the fifth semiconductor layer is capable of exhausting the two-dimensional electron gas inside the heterojunction located in a region under the gate.

5. The manufacturing method according to claim 4, further comprising: allowing the source and the drain to form ohmic contact with the third semiconductor layer.

* * * * *